United States Patent [19]

Kimock et al.

[11] Patent Number: 5,190,807

[45] Date of Patent: * Mar. 2, 1993

[54] ABRASION WEAR RESISTANT POLYMERIC SUBSTRATE PRODUCT

[75] Inventors: Fred M. Kimock, Macungie; Bradley J. Knapp, Allentown; Steven J. Finke, Kutztown, all of Pa.

[73] Assignee: Diamonex, Incorporated, Allentown, Pa.

[*] Notice: The portion of the term of this patent subsequent to Aug. 4, 2009 has been disclaimed.

[21] Appl. No.: 600,210

[22] Filed: Oct. 18, 1990

[51] Int. Cl.$^5$ .................. B32B 17/06; B32B 17/10
[52] U.S. Cl. ........................... 428/216; 428/336; 428/408; 428/426; 428/428; 428/447; 428/697; 428/698; 428/701; 428/702; 428/913; 428/457; 428/469
[58] Field of Search ............. 428/408, 216, 336, 447, 428/426, 428, 698, 697, 701, 702, 446, 913, 469, 457

[56] References Cited

U.S. PATENT DOCUMENTS

| | | | |
|---|---|---|---|
| 4,383,728 | 5/1983 | Litington | 350/1.7 |
| 4,634,648 | 1/1987 | Jansen et al. | 430/84 |
| 4,661,409 | 4/1987 | Kieser et al. | 428/447 |
| 4,698,256 | 10/1987 | Giglia et al. | 428/408 |
| 4,734,339 | 3/1988 | Schachner et al. | 428/698 |
| 4,770,940 | 9/1988 | Ovshinsky et al. | 428/408 |
| 4,783,368 | 11/1988 | Yamamoto et al. | 428/336 |
| 4,847,157 | 7/1989 | Goodman | 428/212 |
| 4,849,290 | 7/1989 | Fujimori et al. | 428/408 |

FOREIGN PATENT DOCUMENTS

| | | |
|---|---|---|
| 0239280 | 9/1987 | European Pat. Off. |
| 203903 | 11/1983 | German Democratic Rep. |
| 204693 | 12/1983 | German Democratic Rep. |
| 61-55603 | 3/1986 | Japan |
| 63-221840 | 9/1988 | Japan |

Primary Examiner—Ellis P. Robinson
Assistant Examiner—Archene A. Turner
Attorney, Agent, or Firm—McCubbrey, Bartels, Meyer & Ward

[57] ABSTRACT

A substantially optically transparent coated substrate product with a highly adherent, abrasion-resistant diamond-like hard carbon coating is disclosed. The substrate product is comprised of a polymeric substrate, an adhesion-mediating polysiloxane polymer layer, one or more intermediate layers and an outer layer of diamond-like hard carbon. In another embodiment of the invention a thin metallic interlayer is disposed between a first interlayer layer and subsequent interlayers and/or diamond-like hard carbon. The invention also allows for the production of adherent thin film interference layer coatings (i.e. quarter wavelength stacks and anti-reflection coatings) using diamond-like hard carbon as the high refractive index layer and the interlayer(s) as the low refractive index layer or, alternatively, using diamond-like hard carbon as the low refractive index layer and the interlayer(s) as the high refractive index layer. The invention further discloses a method for fabricating the coated substrate product. The substrate product, exhibiting excellent resistance to abrasion and chemical attack, is particularly useful for commercial plastic articles such as optical lenses and sunglass lenses made of polycarbonate, CR-39 ®, or acrylic plastics.

56 Claims, 1 Drawing Sheet

ABRASION WEAR RESISTANT POLYMERIC SUBSTRATE PRODUCT

FIELD OF THE INVENTION

This invention relates generally to coated substrate products. More particularly, the invention relates to a substantially optically transparent coated substrate product comprised of a polymeric parent substrate, one or more interlayers and a diamond-like carbon layer, and to a method for producing same.

BACKGROUND OF THE INVENTION

The properties of polymers (i.e., plastics) make them ideal substrate materials for use in many applications. In particular, optically transparent plastics such as polycarbonate, CR-39® (allyl diglycol carbonate) and acrylics have become widely accepted materials for use as optical lenses because of their light weight and ease of molding compared to glass. Polycarbonate also has superior impact resistance compared to glass. However, a major drawback with plastic substrates, particularly polycarbonate, is their poor scratch and abrasion resistance.

Various methods have been employed to enhance the abrasion wear resistance of plastic substrates. For example, many commercial plastic opthalmic and sunglass lenses are coated with either organic acrylate-type polymer coatings or polysiloxane-type polymer coatings. (See, S. Herbert, Industrial Diamond Review, February 1984, at p.77.) Although these polymer coatings offer a significant improvement in abrasion resistance relative to the uncoated plastic lens, the perceived abrasion resistance of the coated plastic lens compared to a glass lens is still poor.

Glass and silicon dioxide have also been employed as coatings on plastic substrates to improve the abrasion resistance. Illustrative are Great Britain Patent No. 1,335,065, and U.S. Pat. Nos. 3,458,342 and 4,328,646. However, the absence of an intermediate layer between the glass or silicon dioxide layer and the plastic substrate often results in the glass or silicon dioxide coating spalling or cracking when the substrate is subjected to thermal cycling.

Several prior art techniques disclose the use of an intermediate layer between the substrate and the glass or silicon dioxide outer layer to improve adhesion of the outer layer. For example, U.S. Pat. No. 4,190,681, issued to Hall, et al., discloses an evaporative deposition technique of a glass layer disposed on top of an intermediate layer of an acrylic-type polymer which has in turn been coated onto a polycarbonate substrate. U.S. Pat. No. 4,200,681, also issued to Hall, et al., discloses the vapor deposition of a top layer of silicon dioxide onto an intermediate primer layer which in turn has been deposited on the surface of a polycarbonate substrate. However, this particular evaporative technique of applying a layer of silicon dioxide is often undesirable for several reasons. First, this technique suffers from inadequate adhesion of the silicon dioxide or glass layer, due to (i) the relatively low reactivity of the evaporated silicon oxide film-forming species, and (ii) insufficient bond strength between the silicon dioxide layer and the underlying carbonaceous acrylic polymer layer. Second, the individual particles of silicon dioxide may evaporate and later condense on the coating surface at rates which vary with the particular site of deposition, resulting in a non-uniform glass surface often characterized by pits, pinholes, and other imperfections.

U.S. Pat. No. 3,713,869, teaches the deposition of an intermediate layer polymerized by glow discharge onto a polycarbonate surface. A hard inorganic glass layer is then vaporized by an electron beam gun onto the intermediate layer in a manner similar to that used by Hall, et al. European Patent Application No. 0,266,225 further discloses a coating in which the plastic substrate is first coated with a silicon-based layer which is overcoated by a top layer of silicon dioxide. U.S. Pat. No. 4,842,941 discloses a polycarbonate substrate with an interfacial layer of resinous composition, and an abrasion-resistant top layer applied by plasma-enhanced chemical vapor deposition. U.S. Pat. No. 4,341,841 discloses an article with a multilayer protective coating, comprising a substrate and two protective layers, one being a vacuum coated ceramic layer, and one being a resinous layer, coated in any order. Although each of these prior art techniques have resulted in limited improvement in the adhesion between the glass or silicon dioxide coating and the substrate, and ultimately the wear resistance of the coated substrate product, the prior art techniques do not contemplate a diamond-like carbon ("DLC") outer layer, nor address the optimum method for obtaining an adherent DLC layer on a polycarbonate substrate.

In all of the aforementioned prior art techniques, the abrasion resistance of the coated plastic substrate has been unsatisfactory because of the limited hardness of the silicon dioxide or glass coating. Additional problems are also encountered by thin oxide coatings. Due to incomplete oxidation or inhomogeneous chemical bonding which is characteristic of oxide films, the films are susceptible to chemical reaction and damage by salt water. This is a particular disadvantage for eyeglass or sunglass lenses which are exposed to perspiration or ocean spray. Finally, under thermal cycling or flexing, the oxide coatings are susceptible to cracking and peeling.

There are also teachings of "mixed phase" or "gradient" inorganic hard coatings for plastic substrates which can be found in the prior art. For example, U.S. Pat. No. 4,830,873, issued to Benz, et al., discloses a process for applying a transparent layer onto the surface of a plastic element by first polymerizing an organic vapor and subsequently introducing additives such as oxygen, hydrocarbon compounds, or nitrogen-containing compounds to the vapor to form a layer with increased hardness. International Patent Application No. WO89/01957 discloses a method for depositing an abrasion-resistant coating comprising the plasma-enhanced chemical vapor deposition of a coating characterized by a gradual transition from a composition consisting essentially of an interfacial material to a composition consisting essentially of an abrasion-resistant material. Further, U.S. Pat. No. 4,777,090, discloses a product which has a disordered carbon coating at the substrate-coating interface and a relatively ordered portion composed of either carbon or silicon dioxide away from the substrate-coating interface. These prior art techniques similarly do not teach the deposition of a hard DLC layer, nor discuss the formation of a discrete multilayer coating structure with a polycarbonate substrate and an adherent DLC outer layer.

There are, however, several prior art references which teach the direct deposition of hard DLC films onto plastic substrates to improve abrasion resistance.

Illustrative are U.S. Pat. Nos. 4,663,183, 4,770,940, 4,783,361, 4,698,256 and 4,877,677, and European Application Nos. 0,280,215 and 0,278,480. These prior art references do not teach the use of interlayer materials which have been found to be essential to achieve satisfactory adherence of the DLC film.

There are also prior art references which teach the deposition of hard DLC films onto plastic substrates with the use of limited interlayer materials. For example, U.S. Pat. No. 4,661,409, issued to Kieser, et al., discloses a substrate having an amorphous carbon coating and an adhesion-mediating interlayer of a siloxane or silazane polymer between the carbon film and the substrate. U.S. Pat. No. 4,569,738, also issued to Kieser, et al., discloses a microwave discharge process for depositing the siloxane or silazane polymer and amorphous carbon layers on the substrate. However, in each of these references only intermediate layers of microwave discharge-deposited siloxane and silazane polymers are discussed.

Although DLC coatings possess excellent optical properties and exhibit excellent resistance to abrasion and chemical attack, DLC coatings have not been widely applied to plastic substrates (including lenses) to date for several reasons. First, while DLC coatings are indeed very hard, they are also brittle when thin. Thus, when applied to soft substrates such as plastics, the DLC coating can crack and/or be crushed into the substrate when a high load or force is applied to the surface of the substrate. This mechanism is also responsible for the apparent scratching of the DLC coating from the surface of plastic substrates in severe abrasive environments.

Second, the adhesion of DLC coatings to plastic substrates has been poor due to the high internal stress associated with the DLC coatings. This poor adhesion has been especially evident during cooling of DLC coated plastic substrates from elevated temperatures. There is also a significant difference in the thermal expansion coefficients between the DLC coating and the plastic substrate. Thus, during thermal cycling the weak adhesive bonding strength at the DLC-plastic interface is overwhelmed by the forces generated by expansion and contraction, and hence, the DLC coating cracks and delaminates.

It is therefore an object of the present invention to provide a plastic substrate with hard coated surface layers, such as diamond-like carbon, firmly adhered thereto, thereby to prevent undesirable separation or crack formation, while at the same time providing excellent hardness and resistance to abrasion, chemical attack and impact.

It is a further object of the present invention to provide an abrasion-resistant plastic substrate with increased ease of cleaning.

It is a further object of the present invention to provide a plastic substrate with a diamond-like hard carbon coating which combines the ability to reflect decorative colors without sacrificing the aforementioned objects.

It is a further object of the present invention to provide a method for depositing an adherent coating incorporating high refractive index diamond-like hard carbon layers in an alternating layer stack along with at least one other material of substantially different refractive index in order to produce thin film interference coatings such as quarter wavelength stacks.

It is a further object of this invention to provide a low cost and efficient process for producing a plastic substrate with superior abrasion wear resistance and reduced chemical reactivity.

SUMMARY OF THE INVENTION

The disclosed abrasion wear resistant coated substrate product substantially reduces or eliminates the disadvantages and shortcomings associated with the prior art techniques. The invention discloses a substantially optically transparent composite structure which comprises a polymeric parent substrate, one or more intermediate layers and a diamond-like carbon layer. The invention also discloses a method for fabricating the coated substrate product.

According to the method, the substrate surface is initially chemically de-greased. In the second step, the substrate is coated with a polysiloxane polymer layer by a flow, dip, spray, or other conventional solution-based coating process. After the polysiloxane polymer layer is thermally cured, the coated surface is chemically cleaned. The substrate surface is then sputter-etched with energetic gas ions to assist in the removal of residual hydrocarbons, as well as alkali metals and other additives. After sputter-etching, one or more interlayers are chemically vapor deposited on the substrate, followed by the deposition of a diamond-like carbon layer. Once the requisite number of interlayers and diamond-like carbon layers have been deposited, the coated substrate is cooled and removed from the reactor.

BRIEF DESCRIPTION OF THE DRAWINGS

Further features and advantages will become apparent from the following and more particular description of the preferred embodiment of the invention, as illustrated in the accompanying drawings, in which like reference characters generally refer to the same parts or elements throughout the views, and in which.

DETAILED DESCRIPTION OF THE INVENTION

Figure 1:
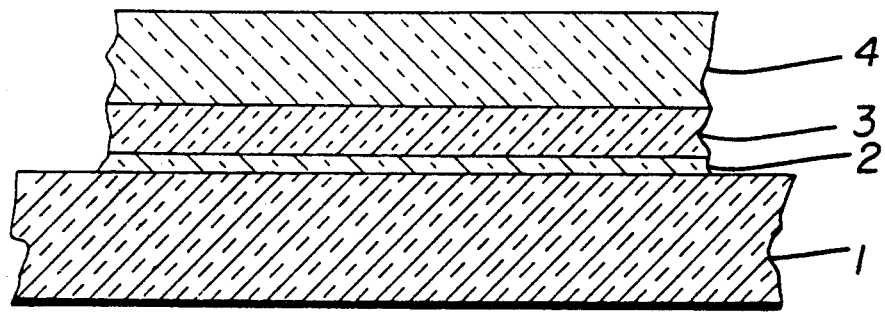
FIG. 1 is a cross-sectional view of the coated substrate product in accordance with the present invention.
Figure 2:
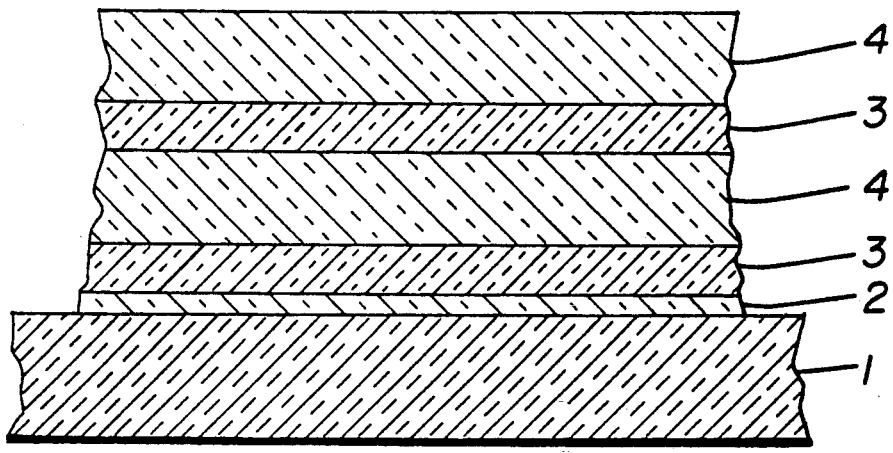
FIG. 2 is a cross-sectional view of the coated substrate product in accordance with a further embodiment of the prevent invention.
Figure 3:
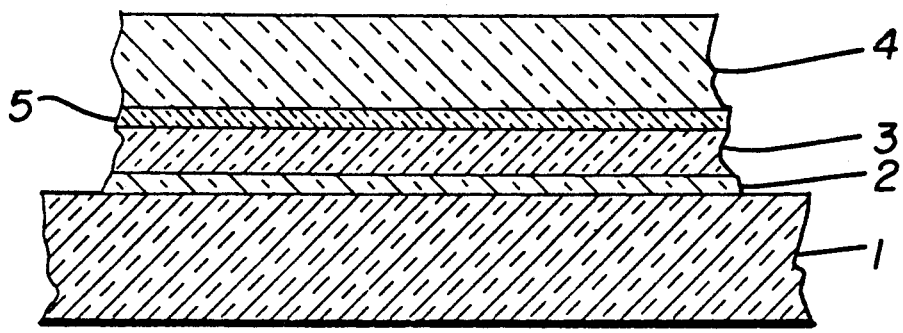
FIG. 3 is a cross-sectional view of the coated substrate product in accordance with a still further embodiment of the present invention. -

In accordance with the present invention, the disclosed abrasion wear resistant coated substrate product substantially reduces or eliminates the disadvantages and shortcomings associated with the prior art techniques. As illustrated in FIGS. 1-3, the disclosed invention is a substantially optically transparent composite structure which comprises a polymeric parent substrate, one or more intermediate layers (interlayers) and a diamond-like carbon layer. By the term of "substantially optically transparent", it is intended to mean transparent to light in the visible region of the electromagnetic spectrum, which is generally between 350 nanometers and approximately 750 nanometers wavelength. A highly important technical advantage of the invention is that the resultant multilayer composite structure has all of the typical attributes of plastics, such as high tensile and impact strength, while also exhibiting excellent resistance to wear and chemical attack.

In the preferred embodiment form of the invention, as illustrated in FIG. 1, the polymeric parent substrate 1 is coated with an adhesion-mediating polysiloxane polymer layer 2 by a conventional dip, flow, spray, or other solution-based coating process. In accordance with the invention, it has been found that adherence of diamond-like carbon ("DLC") film to a polymeric substrate is significantly improved, resulting in decidedly better product lifetime, when one applies an adherence transmitting intermediate layer, such as a polysiloxane polymer, between the polymeric substrate 1 and the diamond-like carbon layer 4 (i.e. inorganic hard layer). The enhanced adhesion between the polymeric substrate and a diamond-like carbon layer 4 is due, in part, to the fact that the elastic modulus and thermal expansion coefficient of the polysiloxane layer 2 is generally intermediate between that of the plastic substrate 1 and the diamond-like carbon layer 4, resulting in reduced expansion mismatch between the substrate 1 and the diamond-like carbon layer 4. Polysiloxane polymers are formed from monomers such as bi-, tri-, and tetra-functional silanes, in which silicon atoms are bonded to hydrogen atoms, alcohol functional groups, or alkoxy functional groups. By conventional condensation polymerization (so-called thermal curing process) these monomeric mixtures are converted to oligomers, and subsequently into a 3-dimensional network polymer by elimination (or condensation) of water or alcohols. The degree of crosslinking in the polysiloxane polymer coating is determined by the amount of tri-, and tetra-functional monomers and/or the amount of prepolymerized cross-linking agents having reactive end groups which are included in the mixture. Polysiloxane polymer coatings can also incorporate additives such as resins (nylon, epoxy, melamine, etc.), hardners, flow control agents, diluents, thickeners, catalysts, dyes, pigments, colloidal suspensions of silicon dioxide and other oxide materials which can be used to modify the properties of the coating. Polysiloxane polymer layers are indeed known per se, but not known has been their excellent suitability as an intermediate layer for improving adherence (primer) between plastics and DLC coatings.

By the term of "polysiloxane polymer", it is thus intended to mean a 3-dimensional network condensation polymer in which silicon atoms are bonded to 2-4 oxygen atoms. In the case of silicon bonded to 2 oxygen atoms, the oxygen atoms are inter-bonded to silicon atoms and these are a part of a

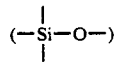

repeating unit in a linear sense, forming linear runs of the polymer, and where the third and fourth bonding positions on the silicon atoms are occupied by unreactive organic functional groups, either alkyl or aryl groups. Furthermore, there will be some number of silicon atoms bonded to 3 oxygen atoms, and a lesser number of silicon atoms bonded to 4 oxygen atoms. In each case, those oxygen atoms bonded to silicon atoms are the cites for linking linear runs of the polymer to form a 3-dimensional network.

The adhesion-mediating polysiloxane polymer layer 2 can be from 1 to 20 microns in thickness. In the preferred embodiment form of the invention, the adhesion-mediating layer is at least 3 microns thick. It has been found that a critical polysiloxane layer thickness of at least 3 microns is necessary to provide the diamond-like carbon layer 4 with adequate mechanical support under high loads. This added support greatly reduces "crushing" of the diamond-like carbon layer 4 into the substrate 1, allowing the amount of abrasion protection offered by the diamond-like carbon layer 4 to be greatly increased.

Following deposition of the adhesion-mediating polysiloxane polymer layer, a first interlayer 3 is chemically vapor deposited onto the substantially optically transparent polymeric parent substrate 1. By the term of "chemically vapor deposited", it is intended to mean materials deposited by vacuum deposition processes, including thermal evaporation, electron beam evaporation, magnetron sputtering, and ion beam sputtering from solid precursor materials; thermally-activated deposition from reactive gaseous precursor materials; and glow discharge, plasma, or ion beam deposition from gaseous precursor materials. Preferably, the first interlayer 3 is deposited onto the parent substrate 1 by ion beam sputtering or magnetron sputtering when dense layers exhibiting compressive stress are desired, or by electron-beam evaporation when layers exhibiting tensile stress are desired, as discussed more fully herein.

The first interlayer 3 generally comprises a substantially optically transparent material devoid of alkali metal atoms and fluorine, and capable of forming a strong chemical bond to the coated substrate 1 and the diamond-like carbon layer 4. By the term of "strong chemical bond", it is intended to mean that the interlayer is composed of a significant amount of an element or elements which are capable of undergoing a chemical reaction with carbon to form carbide-bonding. The absence of alkali metals and fluorine is essential to achieve a highly adherent interface between the first interlayer 3 and the diamond-like carbon layer 4. Thus, the first interlayer 3 must also have the property of providing a barrier to diffusion of alkali metals and additives from the parent substrate 1 to the diamond-like carbon layer 4.

The first interlayer 3 can be from 5 Å to 10,000 Å in thickness, preferably at least 10 Å thick, and may comprise silicon oxide, silicon dioxide, yttrium oxide, germanium oxide, hafnium oxide, tantalum oxide, titanium oxide, zirconium oxide tungsten oxide, molybdenum oxide, boron oxide or mixtures thereof. By the term "oxide", it is intended to mean a stoichiometrically oxidized material, or a partially oxidized material which contains excess metal atoms, or is deficient in oxygen. The first interlayer may further comprise silicon nitride, titanium nitride, tantalum nitride, hafnium nitride, zirconium nitride, boron nitride, tungsten nitride, molybdenum nitride, silicon carbide, germanium carbide and mixtures thereof. By the term "nitride", it is intended to mean a material composed of a stoichiometric amount of nitrogen or a material which either contains excess nitrogen atoms, or is deficient in nitrogen. By the term "carbide", it is intended to mean a material composed of a stoichiometric amount of carbon or a material which either contains excess carbon atoms, or is deficient in carbon.

In the preferred embodiment form of the invention, the first interlayer 3 comprises silicon dioxide. Silicon dioxide is the preferred interlayer material due to (i) its chemical similarity with the polysiloxane polymer adhesion-mediating layer 2 and the resultant affinity to form a strong chemical bond thereto and (ii) its ability to form an excellent chemical bond to diamond-like carbon. In accordance with the invention, it has been found that the thickness of the silicon dioxide first interlayer 3 should be from 200 Å to 2000 Å to achieve optimum adhesion of the diamond-like carbon layer 4. Generally, the necessary thickness of the silicon dioxide interlayer 3 is dependent upon the nature of the polymeric substrate material, the physical characteristics of the diamond-like carbon layer 4 bonded to the silicon dioxide first interlayer 3, and the degree of adhesion required for the particular application. For example, it has been found that when silicon dioxide layers less than approximately 400 Å are employed as coatings over polycarbonate substrates, diamond-like carbon layers of thicknesses greater than 850 Å will undergo adhesion failure when the substrate is thermally cycled. However, silicon dioxide layers of approximately 200 Å are sufficient to promote excellent adhesion with substrates exhibiting a lower thermal expansion coefficient (i.e. CR and acrylic plastics) and/or diamond-like carbon layers of thickness less than 850 Å. In accordance with the invention, it is therefore preferable that the silicon dioxide first interlayer 3 be at least 200 Å thick.

Following deposition of the first interlayer 3 onto the coated parent substrate 1, the diamond-like carbon layer 4 is chemically vapor deposited onto the coated substrate. The diamond-like carbon layer 4 can be from 10 Å to 10 Å micrometers in thickness. Preferably, the diamond-like carbon layer 4 is at least 200 Å thick.

To further enhance the abrasion wear resistance of the structure, more than one interlayer or a plurality of alternating interlayers 3 and diamond-like carbon layers 4 may be deposited onto the parent substrate 1, as shown in FIG. 2. In a further envisioned embodiments of the invention not shown, the structure also may comprise a parent substrate i, an adhesion-mediating layer 2, two or more different interlayers, a first diamond-like carbon layer 4, a first interlayer 3 and a second diamond-like carbon layer 4. It has been found that such arrangements allow for the deposition of a greater total thickness of DLC material, which provides a further increase in abrasion resistance.

However, as the thickness of the coated substrate product increases, control of the stresses in the respective diamond-like carbon layer(s) 4 and the interlayer(s) 3 becomes imperative. For example, if the interlayer 3 (e.g. silicon dioxide) is deposited onto the parent substrate 1 with an excessive tensile stress, the interlayer 3 may craze or crack. If the interlayer 3 is deposited onto the parent substrate 1 with an excessive compressive stress, problems with the adherence of the interlayer 3 and diamond-like carbon layer(s) 4 may be encountered. Therefore in the preferred embodiment form of the invention, the compressive stress in the interlayer(s) 3 is less than the compressive stress in the diamond-like carbon layer(s) 4; more preferably, the compressive stress in the interlayer(s) 3 is intermediate between the compressive stress of the diamond-like carbon layer(s) 4 and the adhesion-mediating layer 2.

Alternatively, the interlayer(s) 3 may be deposited onto the parent substrate 1 under tensile stress. This may be achieved by evaporative deposition of the interlayer(s) 3. The advantage of depositing the interlayer(s) 3 under tensile stress would be that the tensile stress in the interlayer(s) 3 would tend to cancel out the compressive stress in the diamond-like carbon layer(s) 4, allowing for a much thicker composite structure.

In accordance with a further aspect of the invention, the modulus of elasticity and hardness of the interlayer(s) 3 is preferably less than the modulus of elasticity and hardness of the diamond-like carbon layer 4; more preferably, the modulus of elasticity of the interlayer(s) 3 is intermediate that of the diamond-like carbon layer 4 and the adhesion-mediating layer 2, and the hardness of the diamond-like carbon layer 4 is at least twice as hard as the underlying interlayer(s) 3. With this particular arrangement, the impact resistance of the parent substrate 1 will be significantly enhanced.

In another embodiment of the invention, as illustrated in FIG. 3, a second interlayer 5 is chemically vapor deposited onto the coated substrate 1 and positioned such that the second interlayer 5 is disposed between the first interlayer 3 and the diamond-like carbon layer 4. The second interlayer 5 would similarly comprise a substantially optically transparent material devoid of alkali metal atoms and fluorine, and capable of forming a strong chemical bond to the first interlayer 3 and the diamond-like carbon layer 4. The second interlayer 5 may be from 5 Å to 10,000 Å in thickness, preferably at least 10 Å thick, and comprise a substantially optically transparent silicon nitride, titanium nitride, tantalum nitride, tungsten nitride, molybdenum nitride, hafnium nitride, zirconium nitride, boron nitride, yttrium oxide, germanium oxide, hafnium oxide, silicon oxide, silicon dioxide, tantalum oxide, titanium oxide, zirconium oxide, tungsten oxide, molybdenum oxide, boron oxide, silicon carbide, germanium carbide and mixtures thereof.

In the preferred embodiment form of the invention, the second interlayer 5 would similarly comprise silicon dioxide. As previously discussed, the silicon dioxide second interlayer 5 may be from 200 Å to 2000 Å in thickness, preferably at least 200 Å thick.

Since the second interlayer 5 provides a diffusion barrier for alkali metal atoms, fluorine and/or any additional additives which would adversely effect the adherence of the diamond-like carbon layer 4 and since the second interlayer 5 is capable of forming a strong chemical bond with diamond-like carbon, the first interlayer 3 could further comprise a substantially optically transparent aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, cerium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide and mixtures thereof.

The second interlayer 5 may alternatively comprise a substantially optically transparent metallic material capable of reflecting visible light and capable of forming a strong chemical bond with the first interlayer 3 and the diamond-like carbon layer 4, selected from the following two groups. In the first group, the metallic material may consist of silicon, germanium, hafnium, molybdenum, tungsten, yttrium, tantalum, titanium and zirconium. These metallic materials all form a strong chemical bond to the diamond-like carbon layer 4.

The second group of metallic materials comprises vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium. Preferably, the second interlayer 5 comprises rhenium, iridium, tin, indium, aluminum, nickel, iron, chromium, copper, gold, silver and platinum. Although these materials will provide a diffusion barrier to alkali metal atoms and fluorine, they will not form a strong carbide bond with the diamond-like carbon layer 4. Therefore, if any of these metallic materials are selected for the second interlayer 5, a third interlayer (not shown) must be disposed between the second interlayer 5 and the diamond-like carbon layer 4. The third interlayer would similarly be from 5 Å to 10,000 Å in thickness, preferably at least 10 Å thick, and comprise a substantially optically transparent material devoid of alkali metal atoms and fluorine and selected from the group consisting of silicon nitride, titanium nitride, tantalum nitride, tungsten nitride, molybdenum nitride, hafnium nitride, zirconium nitride, boron nitride, yttrium oxide, germanium oxide, hafnium oxide, silicon oxide, silicon dioxide, tantalum oxide, titanium oxide, zirconium oxide, tungsten oxide, molybdenum oxide, boron oxide, silicon carbide, germanium carbide and mixtures thereof. In the preferred embodiment, the third interlayer would comprise silicon dioxide with a thickness of at least 200 Å (as previously discussed). Although it is not necessary, this third interlayer may be employed with the aforementioned first group of metallic materials.

The metallic second interlayer 5 can be from 5 Å to 1000 Å in thickness. Preferably, the metallic second interlayer 5 is at least 25 Å thick.

The thickness of the diamond-like carbon layer(s) 4, and interlayer(s) 3 which are applied over the metallic interlayer 5 can be precisely controlled to produce desired reflected colors such as gold, purple, blue, red, orange, green, etc. In this way, a plastic substrate (such as an optical sunglass lens) can be produced which combines the features of a controlled reflected color with the abrasion wear resistance of the diamond-like carbon coating of the present invention.

In yet another envisioned embodiment of the invention not shown, the embodiment illustrated in FIG. 3 and discussed above may be provided with a second composite layer comprising a first interlayer 3 and a diamond-like carbon layer 4. The resultant multilayer structure would thus be a parent substrate 1, an adhesion-mediating layer 2, a first interlayer 3, a second interlayer 5, a diamond-like carbon layer 4, a first interlayer 3 and a diamond-like carbon layer 4. The structure may alternatively comprise a parent substrate 1, an adhesion-mediating layer 2, two first interlayers 3, a diamond-like carbon layer 4, a first interlayer 3 and a diamond-like carbon layer 4; or a parent substrate 1, and adhesion mediating layer 2, a first interlayer 3, a second interlayer 5, a first interlayer 3, a diamond-like carbon layer 4, a first interlayer 3 and a diamond-like carbon layer 4. The aforementioned illustrative structures are not comprehensive, and other structure configurations may be employed within the scope of the invention to achieve the objectives of excellent resistance to abrasion, chemical attack and impact.

By choosing the appropriate interlayer 3, 5 and diamond-like carbon layer 4 thicknesses, criteria which are known in the art of optical coating design could be employed in each of the aforementioned embodiments of the present invention to produce quarter wavelength stacks and other "dielectric stack" coating configurations. In these dielectric stack configurations, optical interference effects could be used to produce wavelength-selective mirrors or anti-reflection films. Additionally, the reflection of light at predetermined wavelength ranges may be either minimized or maximized by choosing the appropriate thickness of at least one of the interlayers 3,5 and diamond-like carbon layer 4. Superior abrasion wear resistance and environmental durability currently unavailable with conventional optical coatings could thus be realized by the incorporation of the dielectric stack configurations into the present invention.

The method of the present invention teaches those skilled in the art how to fabricate the transparent abrasion wear resistant coated polymeric substrate product. According to the method, the first step involves chemically de-greasing the surface of the parent substrate 1. The substrate 1 is then coated with a polysiloxane polymer layer 2 (see FIG. 1) by a conventional dip, flow, spray or other solution-based coating process. After the polysiloxane layer 2 is thermally cured, the coated surface of the substrate 1 is chemically cleaned. The substrate 1 is then placed into a chemical vapor deposition reactor vacuum chamber and the air evacuated from the chamber to less than approximately $5 \times 10^{-6}$ Torr.

In the next step, the surface of the substrate 1 is sputter-etched with energetic ions or atoms to assist in the removal of residual hydrocarbons, as well as alkali metals and other additives which are commonly present on the surface of the substrate materials. In accordance with the invention, it has been found that the concentration of alkali metals (i.e. Na,Ca) at the surface of a substrate was significantly reduced as a function of ion sputter-etching time and that increased sputter-etching time substantially improved the adhesion of the diamond-like carbon layer 4. [See Examples 1–15] Therefore, it is concluded that the removal of alkali metals and other additives is also essential to achieve a highly adherent interface between parent substrate 1 and the diamond-like carbon layer 4.

The sputter-etching may be performed with a beam of inert gas ions, hydrogen ions or oxygen ions, a glow discharge or a plasma of inert gas, hydrogen or oxygen. In the preferred embodiment form of the invention, sputter-etching is performed with a beam of energetic gas ions at an energy of at least 200 eV.

Following the sputter-etching step, one or more interlayers are chemically vapor deposited onto the parent substrate 1. During a first cycle any of the aforementioned conventional chemical vapor deposition methods may be employed to deposit the interlayers 3,5 The deposition rate of each interlayer 3,5 is generally in the range of about 0.1–10 microns/hour. The total thickness of each interlayer can be in the range of about 5 Å to 10,000 Å. In the preferred embodiment form of the invention, the total thickness for each interlayer 3,5 is at least 10 Å, or at least 200 Å if silicon dioxide is employed.

During the chemical vapor deposition of the interlayers 3,5 it is desirable to operate the reactor chamber at a temperature which is as low as possible. It has been found that decreasing the substrate 1 temperature generally improves the adherence of the diamond-like carbon layer 4 and also eliminates any danger of heating the plastic substrate 1 to a temperature which would be within the softening range for the plastic material. Therefore, in the preferred embodiment form of the invention, the temperature of the parent substrate 1 is maintained at less than 125° C. during the chemical vapor deposition step(s).

After the chemical vapor deposition of one or more interlayers onto the parent substrate 1, a diamond-like carbon layer 4 is deposited onto the coated substrate. The diamond-like carbon layer 4 can be deposited by the following conventional methods; (i) direct ion beam deposition, dual ion beam deposition, glow discharge, RF-plasma, DC-plasma, or microwave plasma deposition from a carbon-containing gas or a carbon-containing vapor which can also be mixed with hydrogen, nitrogen-containing gases, oxygen containing gases and/or inert gas, (ii) electron beam evaporation, ion-assisted evaporation, magnetron sputtering, ion beam sputtering, or ion-assisted sputter deposition from a solid carbon target material, or (iii) combinations of (i) and (ii).

In the preferred embodiment form of the invention, the diamond-like carbon layer(s) 4 is deposited by ion beam deposition from a hydrocarbon gas or carbon vapor. The ion beam deposition may also be performed in combination with an inert gas or hydrogen.

The deposition rate of the diamond-like carbon layer 4 is generally in the range of about 0.1-10 microns/hour. The total thickness of the diamond-like carbon layer 4 is generally in the range of about 10 Å to 10 micrometers. Preferably, the thickness of the diamond-like carbon layer 4 is at least 200 Å thick.

After the deposition of the appropriate interlayers and diamond-like carbon layer(s) 4, as detailed in the aforementioned embodiments, the coated substrate product is cooled by extinguishing the deposition process and passing an inert gas over the substrate until it has reached substantially room temperature. The coated substrate product, exhibiting superior resistance to abrasion and chemical attack, is then removed from the reactor.

The examples which follow demonstrate that abrasion-resistant and highly adherent diamond-like hard carbon coatings can be applied to the surface of plastic substrates, such as optical lenses. The examples are for illustrative purposes only and are not meant to limit the scope of the claims in any way.

Example No. 1 illustrates that the invention can be used to apply adherent and abrasion-resistant diamond-like hard carbon coatings applied to polycarbonate and CR plastic lenses. Example No. 1 also illustrates the critical influence of the polysiloxane polymer layer thickness on the abrasion resistance of the diamond-like carbon coated substrate product. Example Nos. 2-6 illustrate the critical influence of the silicon dioxide interlayer thickness on the adhesion of the diamond-like carbon outer layer. Example Nos. 7-14 illustrate that a variety of reflected colors can be produced by including a metallic layer in the coating stack, and depositing different thicknesses of a silicon dioxide interlayer and diamond-like carbon over the metallic layer. Example No. 15 illustrates the deposition of alternating layers of silicon dioxide and diamond-like carbon over the polysiloxane polymer layer to form a quarter wavelength stack coating made of silicon dioxide and diamond-like carbon.

Table I is a summary of the Young's Modulus and Hardness of the layers used in Examples 1-15.

TABLE I

Young's Modulus and Hardness for typical layers used in the Examples 1-15.*

| Material or Coating | Hardness (GPa) | Young's Modulus (GPa) |
|---|---|---|
| Polycarbonate | 0.23 | 3.8 |
| Polysiloxane (1) | 0.73 | 4.7 |
| $SiO_2$ (2) | 8.6 | 88 |
| DLC (3) | 12-21 | 100-170 |

Notes:
(1) Layer formed by dip coating/thermal curing process
(2) Layer formed by $Ar^+$ ion beam sputter-deposition from a quartz target.
(3) Layer formed by direct ion beam deposition from $CH_4/Ar$ gas.
*All values determined by nanoindentation measurement.

EXAMPLE 1

Eight polycarbonate sunglass lenses and two CR-39 ® clear opthalmic lenses were vapor-degreased with Freon, and then dip-coated with a polysiloxane polymer layer which was thermally cured at approximately 250° F. The polysiloxane layers on each substrate were prepared in an identical fashion, with the exception that the polysiloxane layer thickness was adjusted to be 1.3 microns for polycarbonate lens No. 1, 2.2 microns for polycarbonate lens No. 2, 3.0 microns for polycarbonate lens No. 3, 5.0 microns for polycarbonate lens No. 4, and 3 microns for CR-39 ® lens No. 5. After the curing process was complete, each lens was ultrasonically cleaned in a solvent bath of isopropyl alcohol, and then blown dry with nitrogen gas. The lenses were mounted onto a substrate holder and inserted into a vacuum coating chamber which was evacuated to approximately $4 \times 10^{-6}$ Torr. The substrates were sputter-etched for 20 minutes by a beam of $Ar^+$ ions at an energy of 500 eV and an ion beam current of 90 mA. Next, a 600-Angstroms thick layer of silicon dioxide ($SiO_2$) was deposited onto the lenses by $Ar^+$ ion beam sputter deposition from a quartz target. The lenses were then coated with top layer of diamond-like carbon by direct ion beam deposition using an 11 cm ion beam source operated on 6 sccm of $CH_4$ and 3 sccm of Ar gas at a pressure of approximately $3 \times 10^{-4}$ Torr. The ion energy was 50 eV and the ion beam current was 150 mA. A transparent diamond-like hard carbon layer, 800 Angstroms thick, was deposited onto each lens.

After cooling under Ar gas flow for 5 minutes, the lenses were removed from the reactor. Lenses 1A, 2A, 3A, 4A, and 5A were tested for coating adhesion by immersion in a bath of boiling salt water (5% NaCl) for 20 minutes followed by rinsing in cold water. After removal of the lenses from the salt water bath, all of the coatings appeared undamaged, and did not crack, craze, or peel off the substrate.

Lenses 1B, 2B, 3B, 4B, and 5B were tested for abrasion resistance by NFPA 1981 Standard on Open-Circuit Self-Contained Breathing Apparatus for Fire Fighters (1987 Edition) Test Number 4-9, "Facepiece Lens Abrasion Resistance Test," using vertical weights of 4 and 12 pounds applied to #0000 steel wool. The abrasion test results are summarized in Table II below.

TABLE II

Steel Wool Abrasion Test Results

| Lens No. | Substrate Material | Polysiloxane Thickness | 4-Pound Result | 12-Pound Result |
|---|---|---|---|---|
| 1B | polycarbonate | 1.3 microns | moderate | heavy |
| 2B | polycarbonate | 2.2 microns | moderate | heavy |
| 3B | polycarbonate | 3.0 microns | slight | moderate/heavy |
| 4B | polycarbonate | 5.0 microns | none | slight |
| 5B | CR-39 ® | 3.0 microns | none | none/ |

TABLE II-continued

Steel Wool Abrasion Test Results

| Lens No. | Substrate Material | Polysiloxane Thickness | 4-Pound Result | 12-Pound Result |
|---|---|---|---|---|
| | | | | slight |

Definitions of Observed Damage Results:
Heavy = Many overlapping deep scratches visible to naked eye. Microscopically (200x), DLC coating removed; many scratches deep into substrate.
Moderate = Many isolated scratches visible to naked eye. Microscopically (200x). DLC coating crushed into polysiloxane layer; few deep scratches.
Slight = Few isolated fine scratches visible to naked eye. Microscopically (200x), "indentation scratches" observed, but DLC coating is not cracked.
None = No damage visible to the naked eye. Microscopically, few isolated fine "indentation scratches."

For reference, an uncoated polycarbonate lens exhibited heavy damage when abraded by the steel wool using a 4 pound vertical weight. The abrasion test results clearly demonstrated a dramatic improvement in abrasion resistance when the polysiloxane polymer layer was at least 3 microns thick.

EXAMPLE 2

An 80 mm diameter×2 mm thick neutral gray polycarbonate sunglass lens was coated by the following procedure. After molding, the lens was vapor-degreased with Freon, then dip-coated with a polysiloxane polymer layer which was thermally cured. The polysiloxane layer was 3 microns thick. After the curing process was complete, the lens was ultrasonically cleaned in a solvent bath of isopropyl alcohol, and blown dry with nitrogen gas. The lens was then mounted onto a substrate holder and inserted into a vacuum chamber which was evacuated to about $1.4 \times 10^{-6}$ Torr. The sample was sputter-etched for 3 minutes by a beam of $AR^+$ ions at an energy of 500 eV and an ion beam current of 90 mA. Next, a 850-Angstroms thick layer of $SiO_2$ was deposited onto the lens by $Ar^+$ ion beam sputter deposition from a quartz target. The sample was then coated with diamond-like carbon by direct ion beam deposition from a quartz target. The sample was then coated with diamond-like carbon by direct ion beam deposition using an 11 cm ion beam source operated on 6 sccm of $CH_4$ gas and 3 sccm of Ar gas at a pressure of $1.9 \times 10^{-4}$ Torr. The ion energy was 75 eV and the ion beam current was 180 mA.

After cooling under Ar gas flow for 5 minutes, the lens was removed from the reactor. The coating was then tested for adhesion by immersing the sample in a bath of boiling salt water (5% NaCl) for 30 minutes. After removal of the sample from the salt water bath, the coating appeared undamaged, and did not crack, craze, or peel off the substrate. A cross-hatch/tape adhesion test indicated no adhesion failure of the coating.

EXAMPLE 3

A neutral gray polycarbonate sunglass lens coated with a 1.5-micron thick coating of polysiloxane polymer was prepared by the procedure in Example 2. Next, the lens was inserted into a vacuum coating chamber and evacuated to a pressure of $3 \times 10^{-7}$ Torr. The lens was then sputter-etched for 3 minutes by a beam of $Ar^+$ ions at an energy of 500 eV an an ion beam current of 67 mA. Then, the vacuum coating procedure in Example 2 was repeated, except no $SiO_2$ coating was deposited between the polysiloxane layer and the diamond-like carbon layer. The diamond-like carbon coating cracked and spalled from the substrate surface soon after removal from the vacuum coating chamber, indicating very poor adhesion.

EXAMPLE 4

The procedure in Example 2 was repeated, except the vacuum coating chamber was evacuated to $1.2 \times 10^{-6}$ Torr, and the $SiO_2$ coating thickness was 200 Angstroms. After 30 minutes exposure to boiling salt water, the coating exhibited some crazing (spalling), indicating inadequate adhesion. However, the adhesion of the diamond-like carbon coating was much greater than that found in Example 3.

EXAMPLE 5

The procedure in Example 2 was repeated, except the vacuum coating chamber was evacuated to $2.1 \times 10^{-6}$ Torr, and the $SiO_2$ coating thickness was 550 Angstroms. After 10 minutes exposure to boiling salt water, the diamond-like carbon coating appeared undamaged, and did not crack, craze, or peel off the substrate, indicating excellent adhesion.

EXAMPLE 6

The procedure in Example 2 was repeated, except the vacuum coating chamber was evacuated to $2.5 \times 10^{-6}$ Torr and the $SiO_2$ coating thickness was 650 Angstroms. After 30 minutes exposure to boiling salt water, the diamond-like carbon coating appeared undamaged, and did not crack, craze, or peel off the substrate, indicating excellent adhesion.

EXAMPLE 7

An 80 mm diameter×2 mm thick neutral gray polycarbonate sunglass lens was coated by the following procedure. After molding, the lens was vapor-degreased with Freon, then dip-coated with a polysiloxane polymer layer which was thermally cured. The polysiloxane layer was 3 microns thick. After the curing process was complete, the lens was ultrasonically cleaned in a solvent bath of isopropyl alcohol, and blown dry with nitrogen gas. The lens was then mounted onto a substrate holder and inserted into a vacuum chamber which was evacuated to $5 \times 10^{-6}$ Torr. The substrate was sputter-etched for 4 minutes by a beam of $Ar^+$ ions at an energy of 500 eV and an ion beam current of 90 mA. Next, a 200-Angstroms thick layer of $SiO_2$ was deposited onto the lens by $Ar^+$ ion beam sputter deposition from a quartz target. Then, a 100-Angstroms thick layer of Cr was deposited on top of the $SiO_2$ layer by $Ar^+$ ion beam sputter deposition from a Cr metal target. Then, a 300-Angstroms thick layer of $SiO_2$ was ion beam sputter-deposited on top of the Cr layer. Finally, a 500-Angstroms thick layer of transparent diamond-like hard carbon was deposited on top of the second $SiO_2$ layer by direct ion beam deposition using an 11 cm ion beam source operated on 6 sccm of $CH_4$ and 3 sccm of Ar gas at a pressure of $4.8 \times 10^{-5}$ Torr. The ion energy was 75 eV and the ion beam current was 140 mA. The resultant lens was coated with an abrasion-resistant diamond-like carbon coating and exhibited a violet-blue reflected color.

EXAMPLE 8

An 80 mm diameter×2 mm thick neutral gray sunglass lens was dip-coated with 3 microns of polysiloxane polymer, cleaned, and inserted into a vacuum chamber as described in Example 7. The vacuum chamber was then evacuated to a pressure of $4.5 \times 10^{-7}$ Torr. The substrate was sputter-etched for 4 minutes by a beam of Ar+ ions at an energy of 500 eV and an ion beam current of 90 mA. Next, a 200-Angstroms thick layer of SiO$_2$ was deposited onto the lens by Ar+ ion beam sputter deposition from a quartz target. Then, a 100-Angstroms thick layer of Si was deposited on top of the SiO$_2$ layer by Ar+ ion beam sputter deposition from a Si target. Then, a 300-Angstrom thick layer of SiO$_2$ was ion beam sputter-deposited on top of the Si layer. Finally, a 480-Angstroms thick layer of transparent diamond-like hard carbon was deposited on top of the second SiO$_2$ layer by direct ion beam deposition using the conditions with an abrasion-resistant diamond-like carbon coating and exhibited a pink-gold reflected color.

EXAMPLE 9

An 80 mm diameter×2 mm thick neutral gray sunglass lens was dip-coated with 3 microns of polysiloxane polymer, cleaned, and inserted into a vacuum chamber as described in Example 7. The vacuum chamber was then evacuated to a pressure of $2.0 \times 10^{-6}$ Torr. The substrate was sputter-etched for 4 minutes by a beam of Ar+ ions at an energy of 500 eV and an ion beam current of 90 mA. Next, a 500-Angstroms thick layer of SiO$_2$ was deposited onto the lens by Ar+ ion beam sputter deposition from a quartz target. Then, a 100-Angstroms thick layer of Si was deposited on top of the SiO$_2$ layer by Ar+ ion beam sputter deposition from a Si target. Finally, a 480-Angstroms thick layer of transparent diamond-like hard carbon was deposited on top of the Si layer by direct ion beam deposition using the conditions described in Example 7. The resultant lens was coated with an abrasion-resistant diamond-like carbon coating and exhibited a gold reflected color.

EXAMPLE 10

An 80 mm diameter×2 mm thick neutral gray sunglass lens was dip-coated with 3 microns of polysiloxane polymer, cleaned, and inserted into a vacuum chamber as described in Example 7. The vacuum chamber was then evacuated to a pressure of $3.0 \times 10^{-6}$ Torr. The substrate was sputter-etched for 4 minutes by a beam of Ar+ ions at an energy of 500 eV and an ion beam current of 90 mA. Next, a 200 Angstroms thick layer of SiO$_2$ was deposited onto the lens by Ar+ ion beam sputter deposition from a quartz target. Then, a 100-Angstroms thick layer of Mo was deposited on top of the SiO$_2$ layer by Ar+ ion beam sputter deposition from a Mo target. Then, a 300-Angstroms thick layer of SiO$_2$ was ion beam sputter-deposited on top of the Mo layer. Finally, a 640-Angstroms thick layer of transparent diamond-like hard carbon was deposited on top of the second SiO$_2$ layer by direct ion beam deposition using the conditions described in Example 7. The resultant lens was coated with an abrasion-resistant diamond-like coating and exhibited a blue reflected color.

EXAMPLE 11

A 2.5" wide×6" long×2 mm thick 6-base cylinder violet polycarbonate sunglass lens was dip-coated with 5 microns of polysiloxane polymer, cleaned, and inserted into a vacuum chamber as described in Example 2. Then, the vacuum chamber was evacuated to a pressure of $2 \times 10^{-6}$ Torr. The substrate was sputter-etched for 4 minutes by a beam of Ar+ ions at an energy of 500 eV and an ion beam current of 90 mA. Next, a 860-Angstroms thick layer of SiO$_2$ was deposited onto the lens by Ar+ ion beam sputter deposition from a quartz target. Then, a 100-Angstroms thick layer of Ge was deposited on top of the SiO$_2$ layer by Ar+ ion beam sputter deposition from a Ge target. Then, a 700-Angstroms thick layer of transparent diamond-like hard carbon was deposited on top of the Ge layer by direct ion beam deposition using the conditions described in Example 2.

The resultant lens was coated with an abrasion-resistant diamond-like carbon coating which exhibited a gold reflected color. The diamond-like carbon coating exhibited excellent adhesion after tensile and compression flexing of the lens, and was not damaged after exposure to 30 minutes of boiling salt water.

EXAMPLE 12

A 2.5" wide×6" long×2 mm thick 6-base cylinder violet polycarbonate sunglass lens was dip-coated with 5 microns of polysiloxane polymer, cleaned, and inserted into a vacuum chamber as described in Example 2. The vacuum chamber was then evacuated to a pressure of $2 \times 10^{-6}$ Torr. The substrate was sputter-etched for 4 minutes by a beam of Ar+ ions at an energy of 500 eV and an ion beam current of 90 mA. Next, a 860-Angstroms thick layer of SiO$_2$ was deposited onto the lens by Ar+ ion beam sputter deposition from a quartz target. Then, a 100-Angstroms thick layer of Ge was deposited on top of the SiO$_2$ layer by Ar+ ion beam sputter deposition from a Ge target. Next, a 500-Angstroms thick layer of SiO$_2$ was deposited on top of the Ge layer using the method described above. Finally, a 500-Angstroms thick layer of transparent diamond-like hard carbon was deposited on top of the second SiO$_2$ layer by direct ion beam deposition using the conditions described in Example 2.

The resultant lens was coated with an abrasion resistant diamond-like carbon coating which exhibited a purple reflected color. The diamond-like carbon coating exhibited excellent adhesion after tensile and compression flexing of the lens, and was not damaged after exposure to 30 minutes of boiling salt water.

EXAMPLE 13

A 2.5" wide×6" long×2 mm thick 6-base cylinder violet polycarbonate sunglass lens was dip-coated with 5 microns of polysiloxane polymer, cleaned, and inserted into a vacuum chamber as described in Example 2. The vacuum chamber was then evacuated to a pressure of $5 \times 10^{-6}$ Torr. The substrate was sputter-etched for 4 minutes by a beam of Ar+ ions at an energy of 500 eV and an ion beam current of 90 mA. Next, a 430-Angstroms thick layer of SiO$_2$ was deposited onto the lens by Ar+ ion beam sputter deposition from a quartz target. Then, a 100 Angstroms thick layer of Ge was deposited on top of the SiO$_2$ layer by Ar+ ion beam sputter deposition from a Ge target. Next, a 400-Angstroms thick layer of SiO$_2$ was deposited on top of the Ge layer using the method described above. Then, a 400-Angstroms thick first layer of transparent diamond-like hard carbon was deposited on top of second SiO$_2$ layer using the conditions described in Example 2. Next, a third 400-Angstroms thick layer of SiO$_2$ was deposited on top of the first diamond-like carbon layer using the method described above. Finally, a second 400-Angstroms thick layer of transparent diamond-like carbon was deposited on top of the third SiO$_2$ layer using the conditions described in Example 2.

The resultant lens was coated with an abrasion-resistant diamond-like carbon coating which exhibited a silver-blue reflected color. The diamond-like carbon coating exhibited excellent adhesion after tensile and compression flexing of the lens, and was not damaged after exposure to 30 minutes of boiling salt water.

EXAMPLE 14

A 2.5" wide×6" long×2 mm thick 6-base cylinder violet polycarbonate sunglass lens was dip-coated with 5 microns of polysiloxane polymer, cleaned, and inserted into a vacuum chamber as described in Example 2. The vacuum chamber was then evacuated to a pressure of $2\times10^{-6}$ Torr. The substrate was sputter-etched for 4 minutes by a beam of Ar+ ions at an energy of 500 eV and an ion beam current of 90 mA. Next, a 425-Angstroms thick layer of $SiO_2$ was deposited onto the lens by Ar+ ion beam sputter deposition from a quartz target. Then, a 100-Angstroms thick layer of Ge was deposited on top of the $SiO_2$ layer by Ar+ ion beam sputter deposition from a Ge target. Next, a 440-Angstroms thick second layer of $SiO_2$ was deposited on top of the Ge layer using the method described above. Then, a 440-Angstroms thick first layer of transparent diamond-like carbon was deposited using the conditions described in Example 2. Next, a 440-Angstroms thick third layer of $SiO_2$ was deposited on top of the diamond-like carbon layer, using the method described above. Then, a 440-Angstroms thick second layer of transparent diamond-like carbon was deposited using the conditions described in Example 2. Then, a 440-Angstroms thick fourth layer of $SiO_2$ was deposited as described above. Last, a 440-Angstroms thick third layer of transparent diamond-like carbon was deposited as the final layer of the stack, using the conditions described in Example 2.

The resultant lens was coated with an abrasion-resistant diamond-like carbon coating which exhibited a red-pink reflected color. The diamond-like carbon coating exhibited excellent adhesion after tensile and compression flexing of the lens, and was not damaged after exposure to 30 minutes of boiling salt water.

TABLE III

Summary of results of polycarbonate lenses coated in Examples 8-14

| Ex. | Polysiloxane Thickness | Stack Layer/ Coating Structure | Reflected Color |
|---|---|---|---|
| 7 | 3 microns | 200 Å $SiO_2$/100 Å Cr/ 300 Å $SiO_2$/500 Å DLC | violet blue |
| 8 | 3 microns | 200 Å $SiO_2$/100 Å Si/ 300 Å $SiO_2$/480 Å DLC | pink/gold |
| 9 | 3 microns | 500 Å $SiO_2$/100 Å Si/ 600 Å DLC | gold |
| 10 | 3 microns | 200 Å $SiO_2$/100 Å Mo/ 300 Å $SiO_2$/640 Å DLC | blue |
| 11 | 5 microns | 860 Å $SiO_2$/100 Å Ge/ 700 Å DLC | gold |
| 12 | 5 microns | 860 Å $SiO_2$/100 Å Ge/ 500 Å $SiO_2$/500 Å DLC | purple |
| 13 | 5 microns | 430 Å $SiO_2$/100 Å Ge/ 400 Å $SiO_2$/400 Å DLC/ 400 Å $SiO_2$/400 Å DLC | silver-blue |
| 14 | 5 microns | 425 Å $SiO_2$/100 Å Ge/ 200 Å $SiO_2$/440 Å DLC/ 440 Å $SiO_2$/440 Å $SiO_2$/ 440 Å DLC | red-pink |

EXAMPLE 15

An adherent, abrasion-resistant quarter-wavelength stack reflecting coating was formed on polycarbonate lenses. The layer thicknesses were chosen to maximize reflectance at 550 nanometers. The refractive index of the deposited $SiO_2$ layer was 1.45, and the refractive index of the deposited diamond-like carbon layer was 2.0. The coating was formed as follows.

An 80 mm diameter×2 mm thick neutral gray polycarbonate sunglass lens and an 80 mm diameter×2 mm thick clear polycarbonate lens were dip-coated with 3 microns of polysiloxane polymer, cleaned, and inserted into a vacuum chamber as described in Example 2. The chamber was evacuated to a pressure of $6.0\times10^{-7}$ Torr. The substrates were sputter-etched for 3 minutes by a beam of Ar+ ions at an energy of 200 eV and an ion beam current of 40 mA. Next, a 945-Angstroms thick layer of $SiO_2$ was deposited onto the lenses by Ar+ ion beam sputter deposition from a quartz target. Then, a 685-Angstroms thick layer of transparent diamond-like hard carbon was deposited on top of the first $SiO_2$ layer, using the conditions described in Example 2. Next, a second 945-Angstroms thick layer of $SiO_2$ was deposited as described above. Finally, a second 685-Angstroms thick layer of transparent diamond-like hard carbon was deposited on top of the second $SiO_2$ layer using the conditions described in Example 2. The coating was very adherent, had a high reflectance to visible light (550 nm) and exhibited a pale gold-blue reflected color on the neutral gray lens.

From the foregoing description, one of ordinary skill in the art can easily ascertain that the present invention provides a novel method for producing a substantially optically transparent multilayer composite structure. A highly important technical advantage of the invention is that superior abrasion wear resistance is achieved by use of a multilayer transparent structure comprised of a parent substrate, one or more interlayers and a diamond-like carbon outer layer.

Without departing from the spirit and scope of this invention, one of ordinary skill can make various changes and modifications to the invention to adapt it to various usages and conditions. As such, these changes and modifications are properly, equitably, and intended to be, within the full range of equivalents of the following claims.

What is claimed is:

1. A coated substrate product comprised of a substantially optically transparent polymeric substrate and a first composite layer, said first composite layer comprising a substantially optically transparent adhesion-mediating layer at least 3 microns thick bonded to and disposed towards said substrate of a polysiloxane polymer having a high elasticity and capable of forming a strong chemical bond to said polymeric substrate, a chemically vapor deposit first interlayer bonded to and disposed immediately adjacent to said adhesion-mediating layer of a substantially optically transparent material devoid of alkali metal atoms and fluorine, and a chemically vapor deposited first layer of substantially optically transparent diamond-like carbon bonded to and disposed immediately adjacent to said first interlayer and away from said substrate, said first interlayer being capable of forming a strong chemical bond to said adhesion-mediating layer and diamond-like carbon.

2. The product of claim 1 wherein said first diamond-like carbon layer is at least 200 Å thick.

3. The product of claim 1 wherein said first interlayer comprises a substantially optically transparent material selected from the group consisting of silicon nitride, titanium nitride, tantalum nitride, tungsten nitride, molybdenum nitride, hafnium nitride, zirconium nitride, boron nitride, silicon oxide, silicon dioxide, yttrium oxide, germanium oxide, hafnium oxide, tantalum oxide, titanium oxide, zironium oxide, tungsten oxide, molybdenum oxide, boron oxide, silicon carbide, germanium carbide and mixtures thereof.

4. The product of claim 3 wherein said first interlayer is at least 10 Å thick.

5. The product of claim 1 wherein said first interlayer comprises silicon dioxide at least 200 Å thick.

6. The product of claim 1 wherein the thickness of at least one of said first interlayer and said first diamond-like carbon layer is selected to minimize the reflection of light at predetermined wavelengths.

7. The product of claim 1 wherein the thickness of at least one of said first interlayer and said first diamond-like carbon layer is selected to maximize the reflection of light at predetermined wavelengths.

8. The product of claim 1 wherein the thickness of said first interlayer and said first diamond-like carbon layer corresponds to integer multiples of quarter wavelength optical thickness at predetermined wavelengths.

9. The product of claim 1 wherein the compressive stress of said first interlayer is less than said first diamond-like carbon layer and greater than said adhesion-mediating layer.

10. The product of claim 1 wherein said first interlayer exhibits a tensile stress and said first diamond-like carbon layer exhibits a compressive stress.

11. The product of claim 1 including at least a second composite layer bonded to and disposed immediately adjacent to said first composite layer, said second composite layer comprising a second interlayer bonded to and disposed immediately adjacent to said first diamond-like carbon layer and away from said substrate and a second diamond-like carbon layer bonded to and disposed immediately adjacent to said second interlayer and away from said substrate.

12. The product of claim 11 wherein said second interlayer comprises a substantially optically transparent material selected from the group consisting of silicon nitride, titanium nitride, tantalum nitride, tungsten nitride, molybdenum nitride, hafnium nitride, zirconium nitride, boron nitride, silicon oxide, silicon dioxide, yttrium oxide, germanium oxide, tungsten oxide, molybdenum oxide, boron oxide, hafnium oxide, tantalum oxide, titanium oxide, zirconium oxide, silicon carbide, germanium carbide and mixtures thereof.

13. The product of claim 12 wherein the thickness of said second interlayer is at least 10 Å thick.

14. The product of claim 11 wherein said second interlayer comprises silicon dioxide at lest 200 Å thick.

15. The product of claim 11 wherein the thickness of said second diamond-like carbon layer is at least 200 Å thick.

16. The product of claim 11 wherein the thickness of at least one of said first interlayer, said first diamond-like carbon layer, said second interlayer and said second diamond-like carbon layer is selected to minimize the reflection of light at predetermined wavelengths.

17. The product of claim 11 wherein the thickness of at least one of said first interlayer, said first diamond-like carbon layer, said second interlayer and said second diamond-like carbon layer is selected to maximize the reflection of light at predetermined wavelengths.

18. The product of claim 11 wherein the thickness of said first interlayer, said first diamond-like carbon layer, said second interlayer and said second diamond-like carbon layer corresponds to integer multiples of quarter wavelength optical thickness at predetermined wavelengths.

19. The product of claim 11 wherein the thickness of said first diamond-like carbon layer, said second interlayer and said second diamond-like carbon layer corresponds to integer multiples of quarter wavelength optical thickness at predetermined wavelengths.

20. The product of claim 11 wherein the compressive stress of said second interlayer is less than said second diamond-like carbon layer.

21. The product of claim 11 wherein said second interlayer exhibits a tensile stress and said first diamond-like carbon layer and said second diamond-like carbon layer exhibit a compressive stress.

22. The product of claim 1 wherein said first composite layer includes a chemically vapor deposited third interlayer bonded to and disposed between said first interlayer and said first diamond-like carbon layer of a substantially optically transparent material capable of forming a strong chemical bond to said first interlayer and said first diamond-like carbon layer.

23. The product of claim 22 wherein said first interlayer comprises a substantially optically transparent material selected from the group consisting of silicon nitride, titanium nitride, tantalum nitride, tungsten nitride, molybdenum nitride, hafnium nitride, zirconium nitride, boron nitride, silicon dioxide, silicon oxide, yttrium oxide, germanium oxide, tungsten oxide, molybdenum oxide, boron oxide, hafnium oxide, silicon oxide, silicon dioxide, tantalum oxide, titanium oxide, zirconium oxide, silicon carbide, germanium carbide, aluminum oxide, cerium oxide, tin oxide, thorium oxide, lithium oxide, sodium oxide, potassium oxide, rubidium oxide, cesium oxide, francium oxide, beryllium oxide, magnesium oxide, calcium oxide, strontium oxide, barium oxide, radium oxide, barium fluoride, cerium fluoride, magnesium fluoride, thorium fluoride, calcium fluoride, neodymium fluoride, lead fluoride, sodium fluoride, lithium fluoride, zinc selenide, zinc sulfide and mixtures thereof.

24. The product of claim 22 wherein said third interlayer comprises a substantially optically transparent material selected from the group consisting of silicon nitride, titanium nitride, tantalum nitride, hafnium nitride, tungsten nitride, molybdenum nitride, zirconium nitride, boron nitride, silicon dioxide, silicon oxide, yttrium oxide, germanium oxide, hafnium oxide, tungsten oxide, molybdenum oxide, boron oxide, tantalum oxide, titanium oxide, zirconium oxide, silicon carbide, germanium carbide, and mixtures thereof.

25. The product of claim 24 wherein said third interlayer is at least 10 Å thick.

26. The product of claim 22 wherein said third interlayer comprises silicon dioxide at least 200 Å thick.

27. The product of claim 22 wherein said third interlayer comprises a substantially optically transparent metallic material capable of reflecting visible light selected from the group consisting of silicon, germanium, hafnium, molybdenum, tungsten, yttrium, tantalum, titanium and zirconium.

28. The product of claim 27 wherein said third interlayer is at least 25 Å thick.

29. The product of claim 22 wherein said third interlayer comprises a substantially optically transparent metallic material capable of reflecting visible light selected from the group consisting of vanadium, niobium, chromium, manganese, rhenium, technetium, iron, cobalt, iridium, rhodium, nickel, palladium, platinum, copper, silver, gold, zinc, ruthenium, indium, aluminum, tin, osmium, thallium, lead, antimony, bismuth and polonium.

30. The product of claim 29 wherein said third interlayer is at least 25 Å thick.

31. The product of claim 22 wherein the thickness of at least one of said first interlayer, said third interlayer and said first diamond-like carbon layer is selected to minimize the reflection of light at predetermined wavelengths.

32. The product of claim 22 wherein the thickness of at least one of said first interlayer, said third interlayer and said first diamond-like carbon layer is selected to maximize the reflection of light at predetermined wavelengths.

33. The product of claim 22 wherein the thickness of said first interlayer, said third interlayer and said first diamond-like carbon layer corresponds to integer multiples of quarter wavelength optical thickness at predetermined wavelengths.

34. The product of claim 22 wherein the thickness of said third interlayer and said first diamond-like carbon layer corresponds to integer multiples of quarter wavelength optical thickness at predetermined wavelengths.

35. The product of claim 22 wherein the compressive stress of said third interlayer is less than said first diamond-like carbon layer and greater than said adhesion-mediating layer.

36. The product of claim 22 wherein said third interlayer exhibits a tensile stress and said first diamond-like carbon layer exhibits a compressive stress.

37. The product of claim 22 including a fourth interlayer disposed between said third interlayer and said first diamond-like carbon layer of a substantially optically transparent material devoid of alkali metal atoms and fluorine and capable of forming a strong chemical bond with said third interlayer and said first diamond-like carbon layer.

38. The product of claim 37 wherein said fourth interlayer comprises a substantially optically transparent material selected from the group consisting of silicon nitride, titanium nitride, tantalum nitride, tungsten nitride, molybdenum nitride, hafnium nitride, zirconium nitride, boron nitride, silicon dioxide, silicon oxide, yttrium oxide, germanium oxide, hafnium oxide, tantalum oxide, tungsten oxide, molybdenum oxide, boron oxide, titanium oxide, zirconium oxide, silicon carbide, germanium carbide and mixtures thereof.

39. The product of claim 38 wherein said fourth interlayer is at least 10 Å thick.

40. The product of claim 37 wherein said fourth interlayer comprises silicon dioxide at least 200 Å thick.

41. The product of claim 37 wherein the thickness of at least one of said first interlayer, said third interlayer, said fourth interlayer and said first diamond-like carbon layer is selected to minimize the reflection of light at predetermined wavelengths.

42. The product of claim 37 wherein the thickness of at least one of said first interlaYer, said third interlayer, said fourth interlayer and said first diamond-like carbon layer is selected to maximize the reflection of light at predetermined wavelengths.

43. The product of claim 37 wherein the thickness of said first interlayer, said third interlayer, said fourth interlayer and said first diamond-like carbon layer corresponds to integer multiples of quarter wavelength optical thickness at predetermined wavelengths.

44. The product of claim 37 wherein the thickness of said third interlayer, said fourth interlayer and said first diamond-like carbon layer corresponds to integer multiples of quarter wavelength optical thickness at predetermined wavelengths.

45. The product of claim 37 wherein the compressive stress of said fourth interlayer is less than said first diamond-like carbon layer and greater than said adhesion-mediating layer.

46. The product of claim 37 wherein said fourth interlayep exhibits a tensile stress and said first diamond-like carbon layer exhibits a compressive stress.

47. The product of claim 22 including at least one second composite layer bonded to and disposed immediately adjacent to said first composite layer.

48. The product of claim 47 wherein the thickness of at least one of said first interlayer, said third interlayer, said first diamond-like carbon layer, said second interlayer and said second diamond-like carbon layer is selected to minimize the reflection of light at predetermined wavelengths.

49. The product of claim 47 wherein the thickness of at least one of said first interlayer, said third interlayer, said first diamond-like carbon layer, said second interlayer and said second diamond-like carbon layer is selected to maximize the reflection of light at predetermined wavelengths.

50. The product of claim 47 wherein the thickness of said first interlayer, said third interlayer, said first diamond-like carbon layer, said second interlayer and said second diamond-like carbon layer corresponds to integer multiples of quarter wavelength optical thickness at predetermined wavelengths.

51. The product of claim 47 wherein the thickness of said third interlayer, said first diamond-like carbon layer, said second interlayer and said second diamond-like carbon layer corresponds to integer multiples of quarter wavelength optical thickness at predetermined wavelengths.

52. The product of claim 37 including at least one second composite layer bonded to and disposed immediately adjacent to said first composite layer.

53. The product of claim 52 wherein the thickness of at least one of said first interlayer, said third interlayer, said fourth interlayer, said first diamond-like carbon layer, said second interlayer and said second diamond-like carbon layer is selected to minimize the reflection of light at predetermined wavelengths.

54. The product of claim 52 wherein the thickness of at least one of said first interlayer, said third interlayer, said fourth interlayer, said first diamond-like carbon layer, said second interlayer and said second diamond-like carbon layer is selected to maximize the reflection of light at predetermined wavelengths.

55. The product of claim 52 wherein the thickness of said first interlayer, said third interlayer, said fourth interlayer, said first diamond-like carbon layer, said second interlayer and said second diamond-like carbon layer corresponds to integer multiples of quarter wavelength optical thickness at predetermined wavelengths.

56. The product of claim 52 wherein the thickness of said third interlayer, said fourth interlayer, said first diamond-like carbon layer, said second interlayer and said second diamond-like carbon layer corresponds to integer multiples of quarter wavelength optical thickness at predetermined wavelengths.

* * * * *

UNITED STATES PATENT AND TRADEMARK OFFICE
CERTIFICATE OF CORRECTION

PATENT NO. : 5,190,807
DATED : March 2, 1993
INVENTOR(S) : Kimock, et al.

It is certified that error appears in the above-identified patent and that said Letters Patent is hereby corrected as shown below:

Column 7, line 18, delete "CR" and insert therefor --CR-39®--.

Column 10, line 45, after "5" insert --.--.

Column 11, line 43, delete "CR" and insert therefor --CR-39®--.

Column 13, line 63, delete second occurrence of "an" and insert therefor --and--.

Column 15, line 12, after "conditions" insert --described in Example 7. The resultant lens was coated--.

Column 18, line 54, delete "deposit" and insert therefor --deposited--.

Column 21, line 62, delete "interlaYer" and insert therefor --interlayer--.

Signed and Sealed this

Fourteenth Day of June, 1994

Attest:

BRUCE LEHMAN

*Attesting Officer*     Commissioner of Patents and Trademarks